(12) United States Patent
Harjani et al.

(10) Patent No.: US 7,385,452 B2
(45) Date of Patent: Jun. 10, 2008

(54) VOLTAGE CONTROLLED OSCILLATOR USING CAPACITIVE DEGENERATION

(75) Inventors: Ramesh Harjani, Minneapolis, MN (US); Byung-Hoo Jung, West Lafayette, IN (US)

(73) Assignee: Regents of the University of Minnesota, St. Paul, MN (US)

( * ) Notice: Subject to any disclaimer, the term of this patent is extended or adjusted under 35 U.S.C. 154(b) by 10 days.

(21) Appl. No.: 11/275,974

(22) Filed: Feb. 7, 2006

(65) Prior Publication Data

US 2006/0238266 A1    Oct. 26, 2006

Related U.S. Application Data

(60) Provisional application No. 60/650,489, filed on Feb. 7, 2005.

(51) Int. Cl.
H03B 5/08 (2006.01)
(52) U.S. Cl. ............... 331/167; 331/113 R; 331/117 R; 331/144
(58) Field of Classification Search ................ 331/167, 331/144, 117 R, 113 R
See application file for complete search history.

(56) References Cited

U.S. PATENT DOCUMENTS 5,486,794 A * 1/1996 Wu et al. .................... 331/115
6,411,171 B2 * 6/2002 Itoh ......................... 331/117 R
6,882,237 B2 * 4/2005 Singh et al. ................. 331/185
7,113,050 B1 * 9/2006 Lindgren ............... 331/117 FE
7,145,409 B2 * 12/2006 Lee et al. .............. 331/117 FE
7,176,758 B2 * 2/2007 Rein et al. ................... 330/252
7,218,182 B2 * 5/2007 Muramatsu ............. 331/177 V

OTHER PUBLICATIONS

Jung, B., et al., "A 20GHz VCO With 5GHz Tuning Range in 0.25μm SIGe BiCMOS", *IEEE International Solid-State Circuits Conference (ISSCC, 2004). Digest of Technical Papers*, (2004), 10 pgs.

Jung, B., et al., "High-Frequency *LC* VCO Design Using Capacitive Degeneration", *IEEE Journal of Solid-State Circuits*, 39(12), (Dec. 2004),2359-2370.

Rogers, J. W., et al., "The Effect of Varactor Nonlinearity on the Phase Noise of Completely Integrated VCOs", *IEEE Journal of Solid-State Circuits*, 35(9), (Sep. 2000), 1360-1367.

* cited by examiner

*Primary Examiner*—Robert J. Pascal
*Assistant Examiner*—Levi Gannon
(74) *Attorney, Agent, or Firm*—Schwegman, Lundberg & Woessner, P.A.

(57) ABSTRACT

A VCO is based on a capacitively emitter degenerated topology which uses a cross-coupled MOS pair as the degeneration cell. The cross-coupled MOS pair contributes additional conductance and results in a higher maximum attainable oscillation frequency and better negative resistance characteristics as compared to the other topologies at high frequencies. These properties of the disclosed VCO combined with small effective capacitance enable low-power low-noise high-frequency VCO implementations.

17 Claims, 19 Drawing Sheets

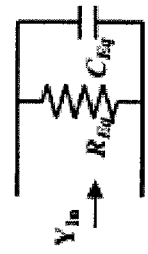
FIG. 2C
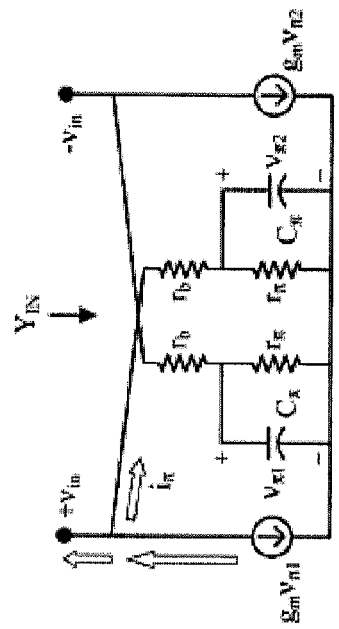
FIG. 2D
FIG. 2B
FIG. 2A

VOLTAGE CONTROLLED OSCILLATOR USING CAPACITIVE DEGENERATION

RELATED APPLICATION

This application claims priority under 35 U.S.C. 119(e) from U.S. Provisional Application Ser. No. 60/650,489 filed Feb. 7, 2005, which application is incorporated herein by reference.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever. Copyright © 2005, Regents of the University of Minnesota.

FIELD

The embodiments relate generally to voltage controlled oscillators and more particularly to a voltage controlled oscillator using capacitive degeneration.

BACKGROUND

Today there are a wide variety of computer and telecommunications devices, such as personal computers (PCs), mobile telephones, and personal digital assistants (PDAs), that need to share information with each other. Generally, this information is communicated from a sending device to a receiving device.

The sending device generally has the data in the initial form of a set of digital words (sets of ones and zeros). In the sending device, a transmitter circuit converts each word into a sequence of electrical pulses, and transmits the sequence of pulses through a cable, circuit board, or other medium to the receiving device. The receiving device includes a receiver circuit that identifies each of the pulses in the signal as a one or zero, enabling it to reconstruct the original digital words.

A key component in both the transmitter and the receiver is a voltage-controlled oscillator, a circuit that produces a signal that varies back and forth between two voltage levels at a frequency based on an input control voltage. The transmitter uses a VCO to place digital information into a high-frequency carrier signal, and the receiver uses a VCO to separate the digital information from the high-frequency carrier signal. Thus, voltage-controlled oscillators (VCOs) are critical building blocks in high-performance communication systems. The ever-increasing demand for bandwidth places very stringent frequency, power, and noise requirements on such systems.

SUMMARY

In general, the embodiments of the invention are directed to a voltage controlled oscillator (VCO) design using capacitive degeneration. The VCO employs a negative resistance cell topology that supports high-frequency performance in a low-power, low-noise implementation.

The VCO may include a negative resistance cell that is based on a capacitively emitter-degenerated topology, but employs a cross-coupled MOS pair as a degeneration cell. The cross-coupled MOS pair contributes additional conductance and allows the negative resistance cell to have a higher maximum attainable oscillation frequency and enhanced negative resistance characteristics in comparison with other topologies at high frequencies. These properties, combined with relatively small effective capacitance, enable low-power, low-noise high-frequency VCO implementations.

In one embodiment, a negative resistance cell is formed by two bipolar transistors that are interconnected via two field-effect transistors, such as NMOS field-effect transistors. An emitter of a first bipolar transistor is coupled to a gate of a first field-effect transistor and a drain of a second field-effect transistor. An emitter of a second bipolar transistor is coupled to a gate of the second field-effect transistor and a drain of the first field-effect transistors. In this manner, the two bipolar transistors are interconnected using the cross-coupled field-effect transistor pair.

The capacitance between the gate and the source of each of the field-effect transistors provides a capacitance that is equivalent to a degeneration capacitor of a capacitive emitter degenerated transistor. In addition, the positive feedback path of the cross-coupled field-effect transistors provides additional transconductance to improve the negative resistance value. The combined effect of the emitter degeneration and the additional transconductance allow the negative resistance cell to generate an effective negative resistance using small bias currents, thus reducing power consumption and noise contribution of the VCO core.

The VCO also may include a current source that: is connected to the source of each of the field-effect transistors. Additionally, the VCO may include one or more buffers to buffer the output of the VCO. In one embodiment, the VCO includes a pair of buffers, one coupled to the emitter of the first bipolar transistor and the other coupled to the emitter of the second bipolar transistor, An exemplary buffer for effectively buffering the output of the VCO is an emitter-follower.

Some embodiments may provide various advantages over simple cross-coupled negative resistance cells and capacitor emitter-degenerated negative resistance cells. For example, the combined effect of the emitter degeneration and the additional transconductance allows the negative resistance cell to generate an effective negative resistance using small bias currents, thus reducing power consumption and noise contribution of the VCO core. In addition, the cross-coupled field-effect transistors increase the maximum attainable oscillation frequency of the VCO. Also, in some embodiments the common-mode admittance of the field-effect transistor pair is near zero reducing the susceptibility of the VCO to common-mode oscillations.

BRIEF DESCRIPTION OF DRAWINGS

Embodiments are illustrated by way of example and not limitation in the figures of the accompanying drawings, in which like references indicate similar elements and in which:

FIGS. 2A-2D illustrate cross-coupled negative resistance cells.

DETAILED DESCRIPTION

In the following detailed description of example embodiments, reference is made to the accompanying drawings which form a part hereof, and in which is shown by way of illustration specific embodiments in which the example method, apparatus and system may be practiced. It is to be understood that other embodiments may be utilized and structural changes may be made without departing from the scope of this description.

In the following detailed description, reference is made to specific examples by way of drawings and illustrations. These examples are described in sufficient detail to enable those skilled in the art to practice the inventive subject matter, and serve to illustrate how the inventive subject matter may be applied to various purposes or embodiments. Other embodiments are included within the inventive subject matter, as logical, mechanical, electrical, and other changes may be made to the example embodiments described herein. Features or limitations of various embodiments described herein, however essential to the example embodiments in which they are incorporated, do not limit the inventive subject matter as a whole, and any reference to the invention, its elements, operation, and application are not limiting as a whole, but serve only to define these example embodiments. The following detailed description does not, therefore, limit embodiments of the invention, which are defined only by the appended claims.

I. LC-Tank-Based VCO Design Factors

This section analyzes the maximum attainable frequency of oscillation of a typical LC VCO which uses the traditional cross-coupled negative resistance cell. In addition, differences in behavior of a BJT-based and a CMOS-based negative resistance cell are discussed. A novel negative resistance cell that overcomes the frequency limits of the traditional cross-coupled negative resistance cell is presented along with design issues related to the novel architecture.

Figure 1:
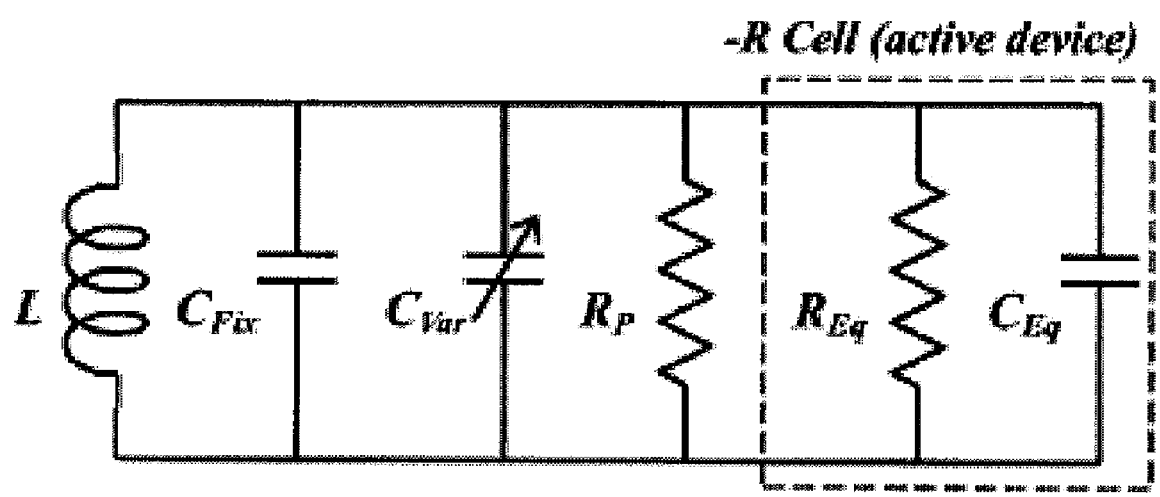
FIG. 1 is an illustration of a parallel LC oscillator circuit model.

FIG. 1 shows a simplified circuit model for a parallel LC oscillator in steady state, where the resistance $R_p$ represents the tank loss, $R_{Eq}$ is the effective negative resistance generated by the active devices, and $C_{Eq}$ is the effective shunt capacitance contributed by the active devices in the negative resistance cell. For stable oscillation, the magnitude of the effective negative resistance $R_{Eq}$ has to be smaller than $R_p$. Additionally, for high-frequency operation where $C_{Var}$ is small, the effective capacitance $C_{Eq}$ becomes comparable to $C_{Var}$ and may significantly limit the maximum attainable oscillation frequency and tuning range.

The traditional cross-coupled cell which is known also as the negative $g_m$ cell is used widely due to its simplicity and its ability for differential signaling. First, limitations of the traditional cross-coupled cell in both BiCMOS and CMOS form are discussed. Though some embodiments are implemented in the IBM SiGe BiCMOS process, for comparison purposes, all simulations discussed in this specification use either the 0.25-m IBM SiGe BiCMOS process or the 0.18-mTSMC CMOS process.

In some parts of this section, small-signal models are used for the behavioral analysis of the different negative resistance cells.

A. Maximum Attainable Oscillation Frequency for the Cross-Coupled Negative Resistance Cell This section evaluates the maximum frequency of oscillation for a given power budget for BJT and MOS implementations of the cross-coupled structure. Several factors (e.g., negative resistance cell design, buffer stage bandwidth, frequency tuning range, and the parasitic capacitances of the constituent components) affect the maximum oscillation frequency. Due to its higher transconductance per unit current, the BJT implementation provides a better $R_{Eq}$. However, as will be shown later, the finite base resistance severely limits the maximum attainable oscillation frequency.

1) Negative Resistance Cell

Mechanisms that degrade high-frequency performance in a cross-coupled negative resistance cell will now be considered. FIGS. 2A-2D show simplified circuit schematics for the BJT-based (FIG. 2A) and CMOS-based (FIG. 2B) cross-coupled cells, the shunt equivalent model (FIG. 2C), and the differential small-signal $R_{Eq} \| C_{Eq}$ model for the BJT version (FIG. 2D). At low frequencies, $R_{Eq}$ is approximately $-2/g_m$ where $g_m$ is the device transconductance. Typically, BJTs have a higher $g_m$ than CMOS transistors for a given bias current and may be a better choice for low-power design. Additionally, the lower flicker noise corner may make BJT devices a better candidate for low-power low-noise oscillator design. However, with increasing frequency, the magnitude of $|R_{Eq}|$ becomes large and eventually $R_{Eq}$ flips over and becomes positive. This is primarily due to the non-negligible base resistance, $r_b$, at high frequencies.

At high frequencies, the impedance offered by the base-emitter capacitance $C_\pi$ becomes comparable to $r_b$ with a result that a larger portion of the base voltage will appear across $r_b$ rather than $C_\pi$. Additionally, there is a phase difference between the voltage across $C_\pi$ and the base voltage due to the resistor-capacitor voltage division. The voltage across $C_\pi$ can be calculated using the small-signal model shown in FIG. 2D. Using the voltage division ratio $v_\pi/v_{in}$, an effective transconductance may be defined as:

$$G_{m,eff} \equiv \frac{v_\pi}{v_{in}} \equiv A g_m \quad (1)$$

In FIG. 2D, the difference between the transconductor current and $i_\pi$ is returned to the signal source, thereby generating a negative resistance. A relationship between the current $i_\pi$ and the conductance associated with this current ($g_\pi$) is given by $g_\pi \equiv i_\pi/v_{in}$. Only the real parts of $G_{m,\,eff}$ and $g_\pi$ contribute to the equivalent negative resistance. Therefore, $R_{Eq}$ can be approximated as $$R_{Eq} \approx \frac{-2}{Re[G_{m,eff}] - Re[g_\pi]} \quad (2)$$

Equation (2) suggests that $R_{Eq}$ degrades rapidly as $Re[g_\pi]$ approaches $Re[G_{m,\,eff}]$ and has a distinct corner frequency which will be revisited next using simulations. An expression for the negative-to-positive transition frequency of $R_{Eq}(\omega_{tran})$ can be calculated by considering the condition $Re[G_{m,\,eff}] - Re[g_\pi] \leq 0$, which results in $$\omega_{tran} = \sqrt{\frac{\left(1 + \frac{r_b}{r_\pi}\right)\left(g_m - \frac{1}{r_\pi}\right)}{r_b C_\pi^2}} . \quad (3)$$

Figure 3A:
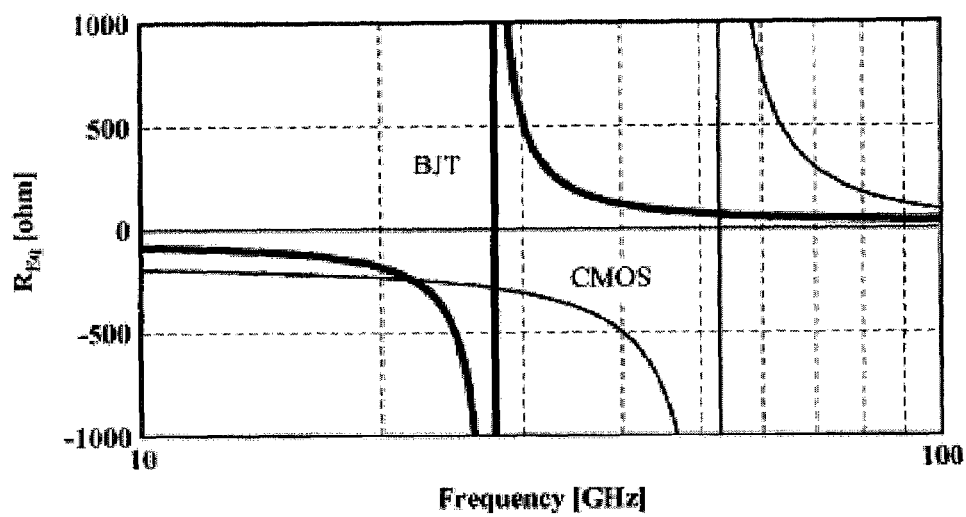
FIGS. 3A and 3B are graphs illustrating the negative resistance for a cross-coupled cell.
Figure 3B:
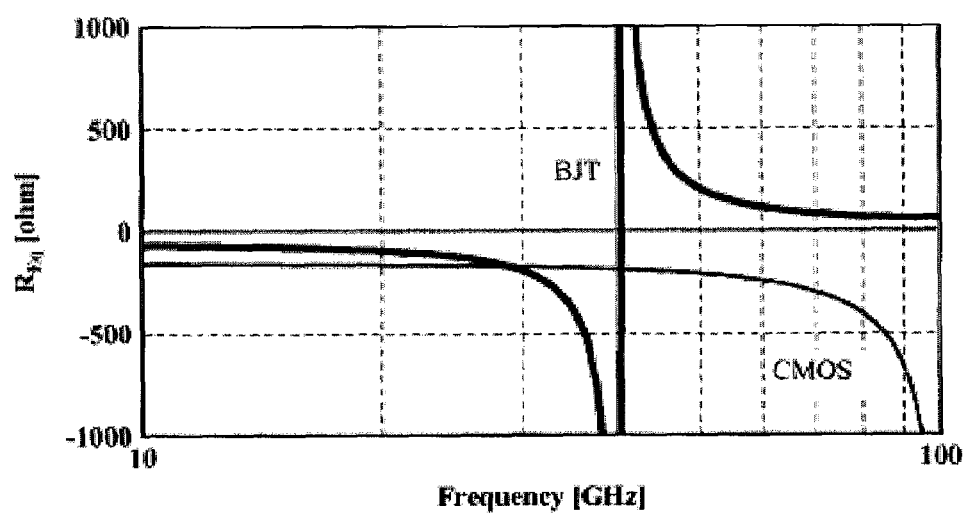

Assuming $r_b/r_\pi \ll 1$, $r_\pi = \beta/g_m$, and $\beta \gg 1$ where $\beta$ is the base-to-collector current gain, then equation (3) can be simplified to $$\omega_{tran} \approx \sqrt{\frac{\omega_T}{r_b C_\pi}} \quad (4)$$

where $\omega_T = g_m/C_\pi$. For the MOS version of the cross-coupled structure, $r_b$ and $C_\pi$ are replaced with $r_g$ and $C_{gs}$. Equation (4) shows that the transition frequency is a strong function of the bias current, device size, and base resistance. In the case of the MOS transistor, a multiple-finger layout may be used to drastically minimize gate resistance. On the other hand, in the case of the BJT transistor, the relatively high base resistance of the BJT in comparison to the gate resistance of the CMOS device can result in a lower transition frequency, despite its higher $\omega_t$. FIG. 3A shows the simulated $R_{Eq}$ and $C_{Eq}$ for the BJT and MOS cross-coupled cells using the 0.25-µm BiCMOS and 0.18-µm CMOS technologies, respectively, at a bias current of 2 mA. It can be seen that the BJT-based design shows a smaller $|R_{Eq}|$ than its CMOS counterpart at low frequencies due to its higher transconductance value. However, it has a much lower transition frequency (~28 GHz) as compared to the CMOS case (~53 GHz). FIG. 3B shows plots for $|R_{Eq}|$ for the BJT and MOS cross-coupled structures using equation (2). It can be seen that equation (2) predicts the rapid degradation of $|R_{Eq}|$ after a certain corner frequency. Increasing the bias current increases $\omega_t$ and hence increases the transition frequency. This implies that a low base (gate) resistance design is desirable not only from a noise performance perspective but also from a low-power implementation perspective. This analysis suggests that a careful layout is desirable to increase the transition frequency especially for the CMOS case where the gate resistance can be reduced substantially by appropriate layout techniques without any serious impact on $\omega_t$ and/or $C_{gs}$.

2) Buffer Stage Design

Figure 4:
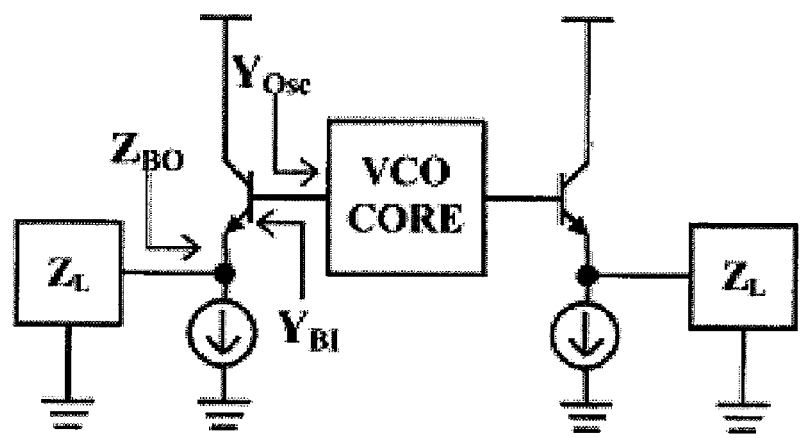
FIG. 4 is circuit schematic for a VCO core coupled to a buffer.

Another factor that impacts the maximum attainable frequency of oscillation is the buffer stage. Buffer stages are usually implemented as emitter followers because of their high input impedance and wide bandwidth. FIG. 4 shows the simplified circuit schematic for the VCO core coupled to a buffer. The input admittance $Y_{BI}$ of the buffer stage can be written as $$Y_{BI} = \frac{1}{Z_L\left[1 + \frac{r_\pi}{1 + j\omega C_\pi r_\pi}\left(g_m + \frac{1}{Z_L}\right)\right]}. \quad (5)$$

When the load impedance is resistive, $Z_L = R_S$, the effective input shunt resistance and capacitance looking into the buffer are given by $$R_{Eq,BI} = R_S \frac{\left[1 + \beta\left(1 + \frac{1}{g_m R_S}\right)\right]^2 + \left(\beta\frac{\omega}{\omega_T}\right)^2}{1 + \beta\left(1 + \frac{1}{g_m R_S}\right) + \left(\beta\frac{\omega}{\omega_T}\right)^2} \quad (6)$$

$$\approx R_S\left[1 + \left(\frac{\omega_T}{\omega}\right)^2\left(1 + \frac{1}{g_m R_S}\right)^2\right]$$

$$C_{Eq,BI} = C_\pi \frac{r_\pi^2\left(\frac{g_m}{R_S} + \frac{1}{R_S^2}\right)}{\left[1 + r_\pi\left(g_m + \frac{1}{R_S}\right)\right]^2 + (\omega C_\pi r_\pi)^2} \quad (7)$$

$$\approx \frac{1}{\omega_T R_S}\frac{\left(1 + \frac{1}{g_m R_S}\right)}{\left(1 + \frac{1}{g_m R_S}\right)^2 + \left(\frac{\omega}{\omega_T}\right)^2}.$$

If it is assumed that $\beta \gg 1$ and $\omega \sim \omega_T$, then the approximations shown in equations (6) and (7) may be made. It is desirable that $R_{Eq,\,BI}$ is large enough so as not to reduce the loaded Q of the tank, while $C_{Eq,\,BI}$ is small enough not to limit the frequency tuning range. In many integrated transceiver designs, the buffer drives an internal capacitive load $C_L$, in which case the effective shunt resistance and capacitance looking into the buffer input are now as follows:

$$R_{Eq,BI} = -\frac{(1+g_m r_\pi)^2 + \omega^2 r_\pi^2 (C_\pi + C_L)^2}{\omega^2 r_\pi C_L (g_m r_\pi C_\pi - C_L)} \quad (8)$$

$$C_{Eq,BI} = \frac{(1+g_m r_\pi)C_L + \omega^2 r_\pi^2 C_\pi C_L (C_\pi + C_L)}{(1+g_m r_\pi)^2 + \omega^2 r_\pi^2 (C_\pi + C_L)^2}. \quad (9)$$

Figure 5:
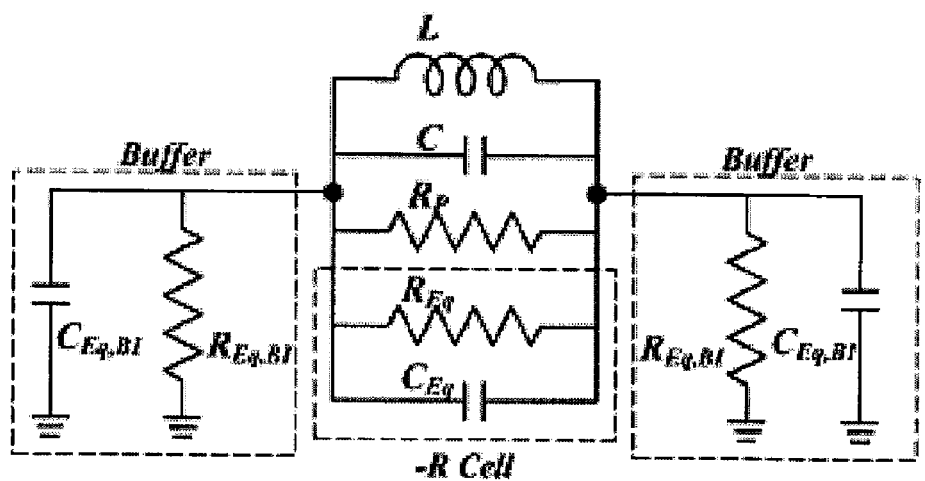
FIG. 5 illustrates a parallel LC oscillator model including buffer stage impedance.

Equation (8) predicts a negative input resistance at the buffer input when $g_m r_\pi > C_L / C_\pi$. This condition is easily met as $g_m r_\pi (=\beta)$ can easily be greater than ten. This additional negative resistance provided by the buffer can be utilized by the VCO core when driving a capacitive load. FIG. 5 shows the small-signal model for the VCO core and buffer load. The combined negative resistance is equal to $(R_{Eq} \| 2 R_{Eq,BI})$. The negative resistance provided by the buffer reduces the $g_m$ requirement of the cross-coupled cell and hence can be used to reduce power consumption and noise. Equation (9) predicts that the effective shunt capacitance is smaller than $C_\pi$ or $C_L$, which allows for high-frequency design and wider tuning range. This basic negative resistance seen in the buffer due to capacitive emitter degeneration may be used to build a novel negative resistance cell for the VCO as described in the following sections.

Figure 6A:
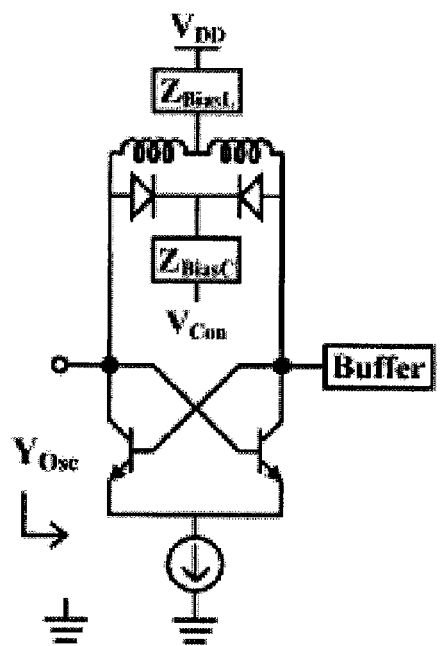
FIGS. 6A and 6B are oscillator output admittance examples for BJT and MOS VCOs.
Figure 6B:
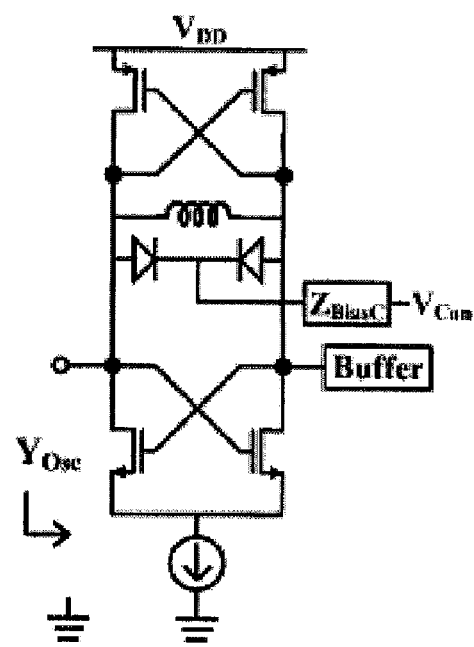

The impedance looking at the output of the buffer $Z_{BO}$ determines the bandwidth of the buffer. In a normal common base amplifier configuration, the output impedance is equal to $\sim 1/g_{m,\,buffer}$ at low frequencies. However, when driven by a high-impedance oscillator, $Y_{OSC}$ affects $Z_{BO}$ as shown in FIG. 4. The output impedance for this configuration is given by $$Z_{BO} = \frac{Z_\pi + Z_{OSC}}{g_{m,buffer} Z_\pi + 1} \quad (10)$$

where $Z_\pi = (1/s\ C_\pi \| r_\pi)$ and $Z_{OSC} = 1/Y_{OSC}$. FIGS. 6A and 6B show circuit and bias details for MOS (FIG. 6A) and bipolar (FIG. 6B) oscillator cores. The oscillator admittance $Y_{OSC}$ is a strong function of $Z_{biasL}$ and $Z_{biasC}$ as well as $Y_{BI}$. Nevertheless, because the real part of $Z_{BO}$ tends to increase with an increasing base impedance, an optimistic pole frequency produced at the emitter of the buffer stage can be derived and given by $$\omega_{Pole} = \frac{g_{m,buffer}}{C_L} \quad (11)$$

Figure 7:
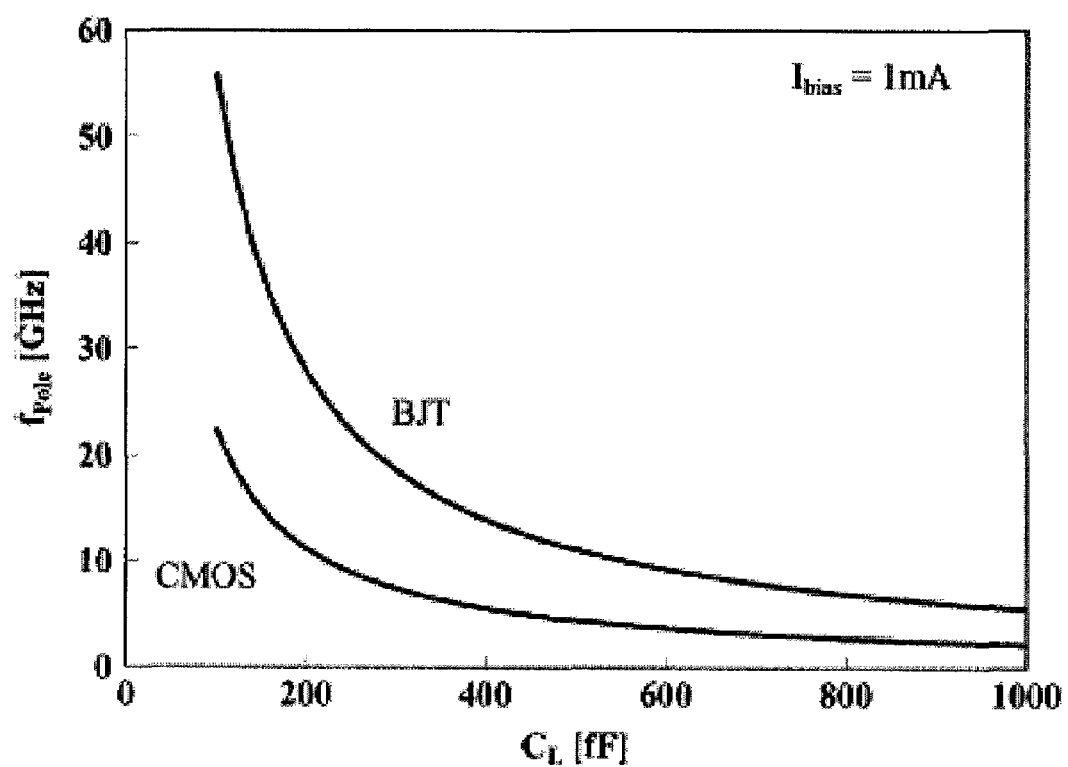
FIG. 7 illustrates pole frequency versus load capacitance of the buffer stage.

This pole frequency has to be higher than the oscillation frequency to prevent output signal attenuation. More importantly, the signal suffers fairly large phase shift around the pole frequency, and relatively small process variations can introduce large relative phase shift between two output signals when the pole frequency is close to the oscillation frequency. FIG. 7 is a plot of the pole frequency $\omega_{Pole}$ as a function of the load capacitance $C_L$ at the output of the buffer stage for bipolar and MOS implementations at a 1-mA bias current. The MOS design has a lower pole frequency even with a relatively small load capacitance due to its lower $g_m$. This implies that, even though the MOS cross-coupled cell can provide a negative resistance up to very high frequencies, the smaller bandwidth of the buffer stage can limit the practical maximum attainable oscillation frequency.

3) Parasitic Capacitance and Tuning Range

Another factor that determines the maximum attainable oscillation frequency for a given technology and power budget are the parasitic capacitances of the various components. The maximum oscillation frequency of the circuit in FIG. 1 is $1/\sqrt{L(C_{Fix}+C_{Eq})}$. When a desired tuning range $\Delta\omega$ is required, the maximum attainable center frequency can be described as $$\omega_{\text{Max}} = \frac{1}{\left(1 + \frac{\text{Tune}}{200}\right)\sqrt{L_{\text{Min}}(C_{Fix} + C_{Eq})}} \quad (12)$$

where Tune is the tuning range as a percentage of the center frequency, $L_{Min}$, is the smallest feasible inductance without suffering severe process variations, $C_{Ex}$ is the fixed sum of parasitic capacitances contributed by the varactor, the inductor, and the buffer, and $C_{Eq}$ is the effective shunt capacitance of the negative resistance cell. The effective capacitance of the cross-coupled cell is $\sim C_\pi/2$. At high frequencies, this along with the effective capacitance from the buffer stage may become a significant portion of the overall capacitance and limit the maximum attainable oscillation frequency and tuning range.

This subsection showed the mechanisms that degrade the $R_{Eq}$ generated by the cross-coupled cell and showed how the effective capacitance from the buffer and negative resistance cell limits the maximum attainable frequency and tuning range. These limitations have motivated a new negative resistance cell, described in the next subsection, that has a higher negative to positive transition frequency and lower effective capacitance, thereby enabling low-power low-noise high-frequency design. While the embodiments are technology-independent, certain benefits are realized in BiCMOS embodiments, and hence the following sections will focus on a BiCMOS design.

B. Novel Negative Resistance Cell Design

Figure 8:
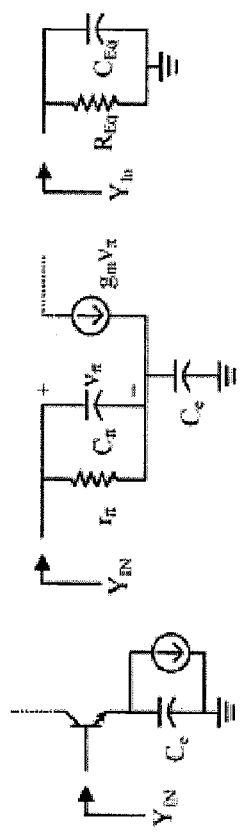
FIG. 8 illustrates a single-ended negative resistance cell using capacitive emitter degeneration.

As seen in the previous section, a capacitive emitter degenerated transistor can generate a negative resistance. FIG. 8 shows a single-ended negative resistance cell using capacitive emitter degeneration. The $R_{Eq}$ and $C_{Eq}$ can be described using the formulas in (8) and (9). When a voltage is applied to the base, part of it appears across $C_\pi$, which in turn generates the transconductor current. Part of this transconductor current is returned to the signal source itself via the capacitor-capacitor divider. A portion of this returning current has a 180 phase shift from the applied voltage and this results in a negative resistance. This negative resistance cell has a very small effective capacitance. First, $C_\pi$ and $C_e$ are in series. Second, the $g_m$ cell affects the charge buildup across each capacitor and increases the effective $C_\pi$ while decreasing the effective $C_e$, thus further reducing the effective series capacitance. This cell also has a high $R_{Eq}$ transition frequency. The small effective capacitance has a higher impedance than $C_\pi$, resulting in a smaller effective $r_g$. This causes the voltage drop across $r_g$ and the phase shift from the base voltage to the voltage across $C_\pi$ to be smaller than in the cross-coupled cell. So, it retards the degradation mechanism and increases the transition frequency. However, emitter degeneration decreases the effective transconductance. Because the $R_{Eq}$ transition frequency is also a function of $g_m$, the reduced effective transconductance limits the improvement in the $R_{Eq}$ transition frequency and increases the $|R_{Eq}|$ value. The increased $|R_{Eq}|$ typically requires a higher Q tank design and hence higher Q inductor design which is nontrivial at high frequencies.

Figure 9:
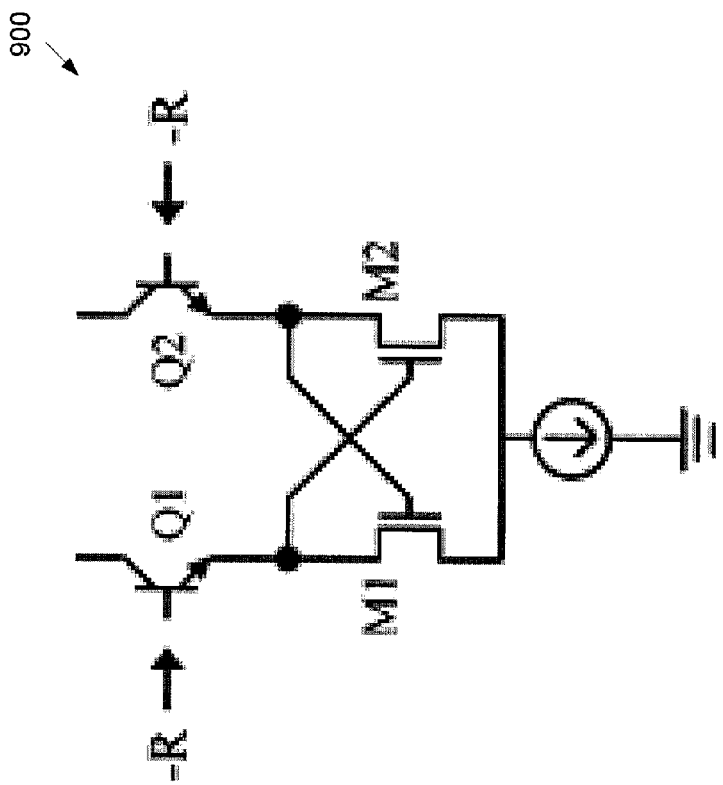
FIG. 9 illustrates a differential negative resistance cell using capacitive degeneration and cross-coupled MOS transistors according to embodiments of the invention.
Figure 10:
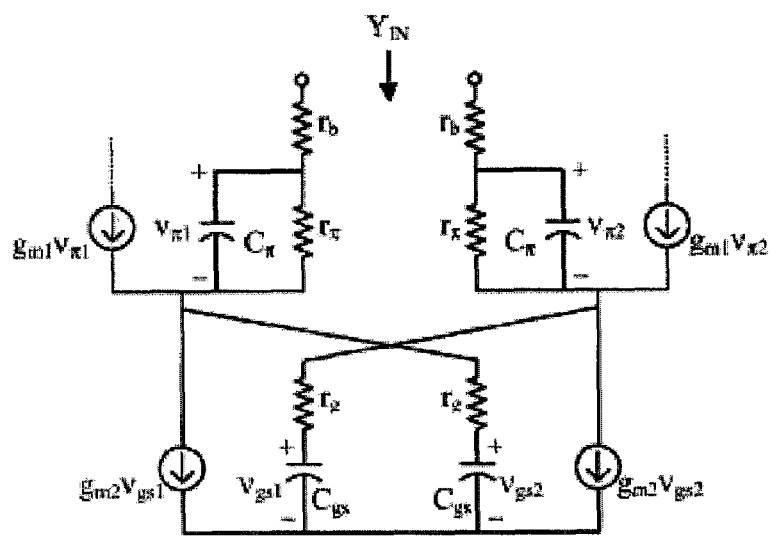
FIG. 10 illustrates an equivalent small-signal circuit model for the negative resistance cell illustrated in FIG. 9 according to embodiments of the invention.

A novel capacitive emitter-degenerated negative resistance cell that mitigates the reduction in issue mentioned above will now be discussed. FIG. 9 illustrates a novel negative resistance cell 900. In some embodiments, two capacitive emitter-degenerated negative resistance cells Q1 and Q2 are interconnected by using a cross-coupled NMOS pair M1 and M2. The gate and drain of each NMOS device is connected to the emitters of each negative resistance cell, respectively. The cross-coupled NMOS pair M1 and M2 works both as emitter-degenerating capacitors and provides additional transconductance to improve the negative resistance value. FIG. 10 shows the equivalent small-signal circuit model for the novel negative resistance cell. The input admittance can be calculated as $$Y_{IN} = \frac{\frac{1}{2}\left[g_{m2}\left(\frac{r_g}{Z_g}-1\right)+\frac{1}{Z_g}\right]}{[1+g_{m1}Z'_\pi]+Z_\pi\left[g_{m2}\left(\frac{r_g}{Z_g}-1\right)+\frac{1}{Z_g}\right]} \quad (13)$$

where $Z'_\pi=(r_\pi \| 1/sC_\pi), Z_\pi=r_b+Z'_\pi, Z_g=r_g+1/sC_{gs}$, and $g_{m1}$ and $g_{m2}$ are transconductances of the BJT and the nMOS transistor, respectively. If $r_b$ and $r_g$ are ignored, the equivalent shunt resistance is given by $$R_{Eq} = \frac{-2\left[\left(\frac{1}{r_\pi}+\Delta g\right)^2+(\omega C_T)^2\right]}{\left(\frac{1}{r_\pi}+\Delta g\right)\left(\frac{g_{m2}}{r_\pi}+\omega^2 C_{gs}C_\pi\right)-\omega^2 C_T\left(\frac{C_{gs}}{r_\pi}-C_\pi g_{m2}\right)} \quad (14)$$

where $\Delta g_m = g_{m1}-g_{m2}$ and $C_T=C_\pi-C_{gs}$. For a fixed bias current, the $g_m$ of the BJT is to first-order insensitive to device geometry, but the $g_m$ of MOS device increases as the square root of the device size. To find an optimum $g_{m1}/g_{m2}$ ratio, let $g_{m1}=\delta g_{m2}$, and $g_{m2}=K\sqrt{C_{gs}}$, where K is a constant. Using this relationship and assuming that $g_{m1}r_\pi \gg 1$, then equation (14) can be simplified to:

$$R_{Eq} = \frac{-\frac{2}{\delta}\left[(1-\delta)^2+\left(\frac{\omega}{\omega_T}\right)^2\left(1+\frac{\Gamma^2}{C_\pi}\right)\right]}{(1-\delta)g_{m1}\left(\frac{1}{\beta}+\frac{\omega^2\Gamma}{\omega_T K}\right)-\omega^2\left(\frac{\Gamma}{\beta K}-\frac{1}{\omega_T}\right)(C_\pi+\Gamma^2)} \quad (15)$$

where $\omega_T = g_{m1}/C_\pi$ and $\Gamma = \Delta g_{m1}/K$

Figure 11:
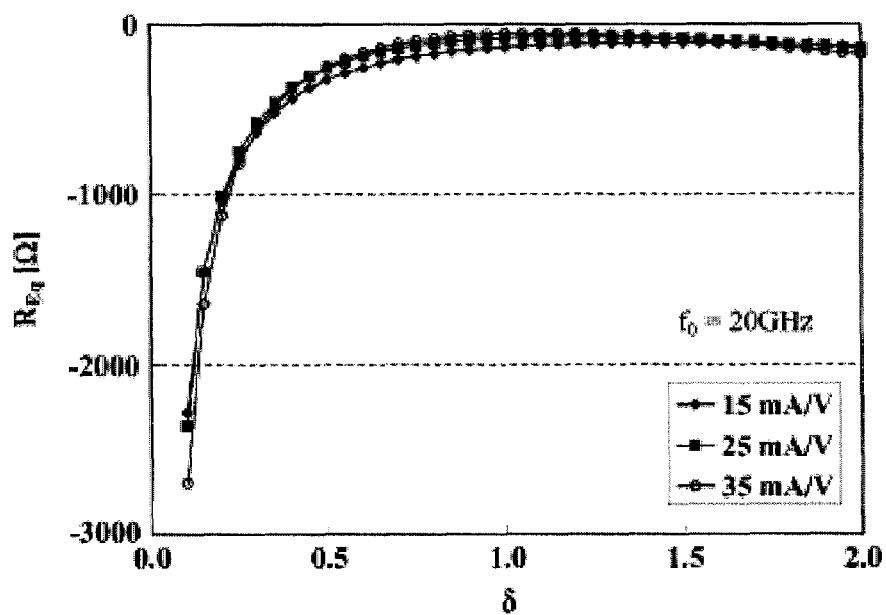
FIG. 11 is a plot of R versus δ for different values of $g_{m1}$.

FIG. 11 is a plot of the expression in equation (15) as a function of δ for different values of $g_{m1}$. This shows that the $R_{Eq}$ is optimized when δ is near unity, i.e., $g_{m1} \approx g_{m2}$. Additionally, it shows that this ratio is more critical than the magnitude of $g_{m1}$ itself. For example, a 15-mA/V-15-mA/V combination results in a better $R_{Eq}$ than a 30-mA/V-15-mA/V combination.

Figure 12:
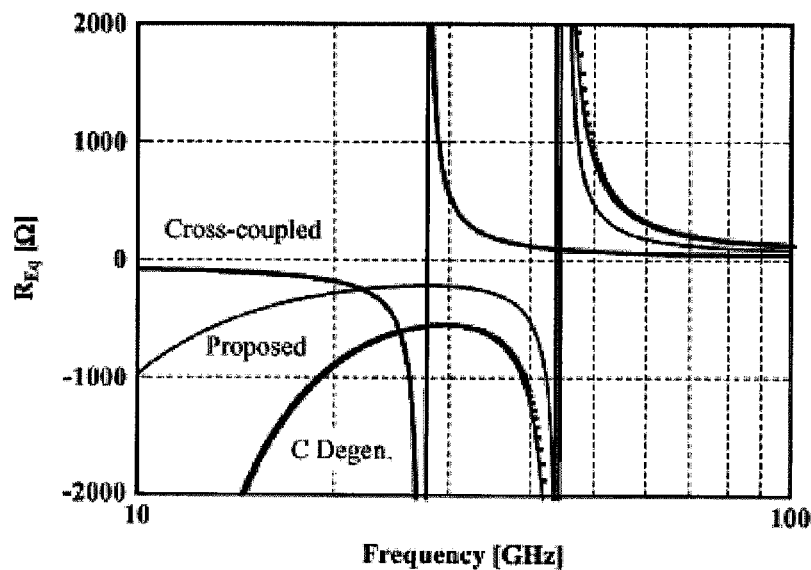
FIG. 12 is a plot of simulated $R_{Eq}$ for the cross-coupled, capacitively degenerated, and cells according to embodiments of the invention.
Figure 13:
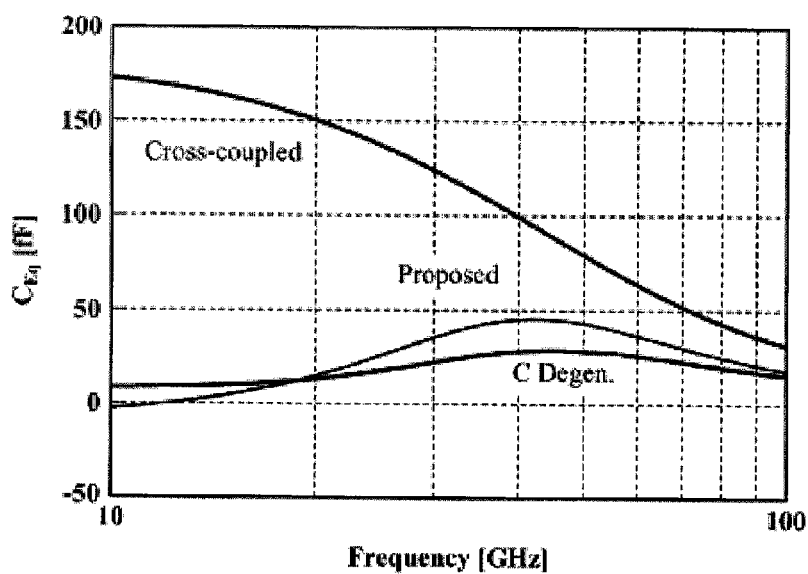
FIG. 13 is a plot of simulated $R_{Eq}$ for the cross-coupled, capacitively degenerated, and cells according to embodiments of the invention.

FIGS. 12 and 13 show the simulated $R_{Eq}$ and $C_{Eq}$ results for the cross-coupled cell, the simple capacitively degenerated cell, and the novel cell 900, respectively. All designs use a 2-mA bias current and use the same BJT size. As shown in FIGS. 12 and 13, the simple capacitive degeneration cell shows a higher $R_{Eq}$ transition frequency but a larger $|R_{Eq}|$ in comparison to the cross-coupled cell. The novel cell 900 also has a higher transition frequency in comparison to the cross-coupled cell, but it shows a better $R_{Eq}$ in comparison to the simple capacitively degenerated cell. This implies that the novel cell 900 may be particularly useful for low-power low-noise design for frequencies above the transition frequency of the cross-coupled cell. This is because it does not generally require an increased bias current for a proportional increased $g_m$, which would also increase the noise from the transistor. FIG. 13 shows that the novel cell 900 has a slightly higher $C_{Eq}$ in comparison with the simple capacitively degenerated cell between 20-40GHz, but this value is much smaller than the value of $C_{Eq}$ of the cross-coupled cell. Additionally, in some embodiments the novel cell 900 shows an inductive impedance at low frequencies as shown in FIG. 13. This simulated inductance using an active device and capacitor has a lower Q in comparison with a passive inductor and, due to its large inductance value, it has minimal effect on the oscillator operation even if the tank is tuned within that frequency range. However, it shows that it is possible to build a parasitic capacitance free negative resistance cell.

The analysis results in FIG. 11 suggest that a BJT-BJT combination instead of a BJT-MOS combination may be preferred for better $g_m$ matching for the novel cell. However, even though a BJT-BJT combination may result in a better $R_{Eq}$, the relatively high $r_b$ of the BJT typically results in a low transition frequency, and its benefit reduces to the small effective capacitance only.

C. Common-Mode and Differential-Mode Oscillation

Figure 14C:
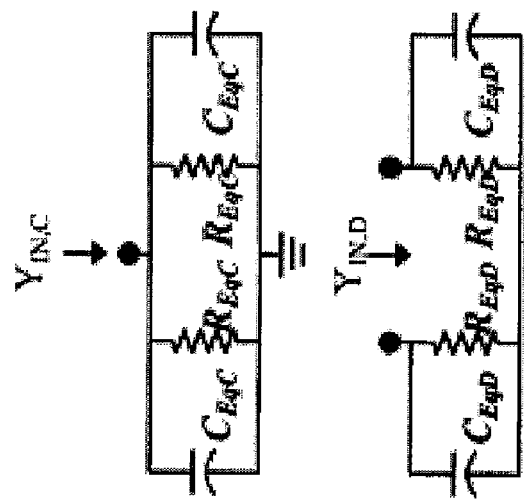
FIG. 14 illustrates a common-mode circuit equivalent for a capacitively emitter-degenerated cell according to embodiments of the invention.
Figure 14B:
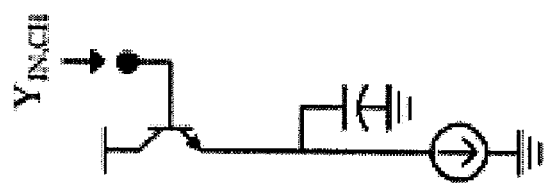
Figure 14A:
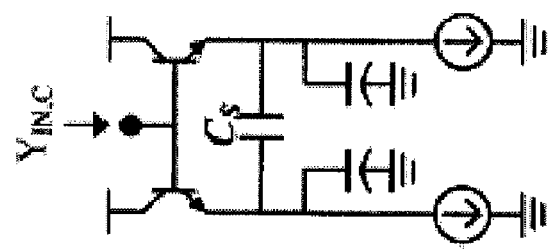

One distinct difference between the capacitively degenerated cell and the cross-coupled cell is its common-mode behavior. The common-mode input admittance for the ideal cross-coupled cell in FIG. 2 is near zero ($Y_{in} \approx 0$). FIG. 14 shows the common-mode equivalent circuit schematic for the capacitively degenerated cell. Unlike the cross-coupled cell, each half circuit of the capacitively emitter degenerated cell provides negative resistance. However, for common-mode signals, the emitter degeneration capacitor connected between two emitters in series ($C_S$) does not have any effect on the common-mode impedance. Only the capacitors connected to the ground act as a degeneration capacitor. Therefore, when $C_S=0$, each half of the circuit has the same effective resistance and capacitance as in the differential mode, i.e., $R_{EqD}=R_{EqC}$ and $C_{EqD}=C_{EqC}$. In this case, the differential- and common-mode admittances can be described as $$R_{EqH} = R_{EqC} = R_{EqD} \quad (16)$$
$$C_{EqH} = C_{EqC} = C_{EqD}$$
$$Y_{IN,C} = \frac{2}{R_{EqH}} + j\omega 2C_{EqH}$$
$$Y_{IN,D} = \frac{1}{2R_{EqH}} + j\omega \frac{C_{EqH}}{2}.$$

The equations predict that the common-mode $|R_{Eq}|$ is four times smaller than the differential-mode $|R_{Eq}|$, and common-mode $C_{Eq}$ is four times larger than the differential-mode $C_{Eq}$. This implies that the capacitive emitter degeneration cell is more prone to oscillate in common-mode when $C_S=0$.

Figure 15:
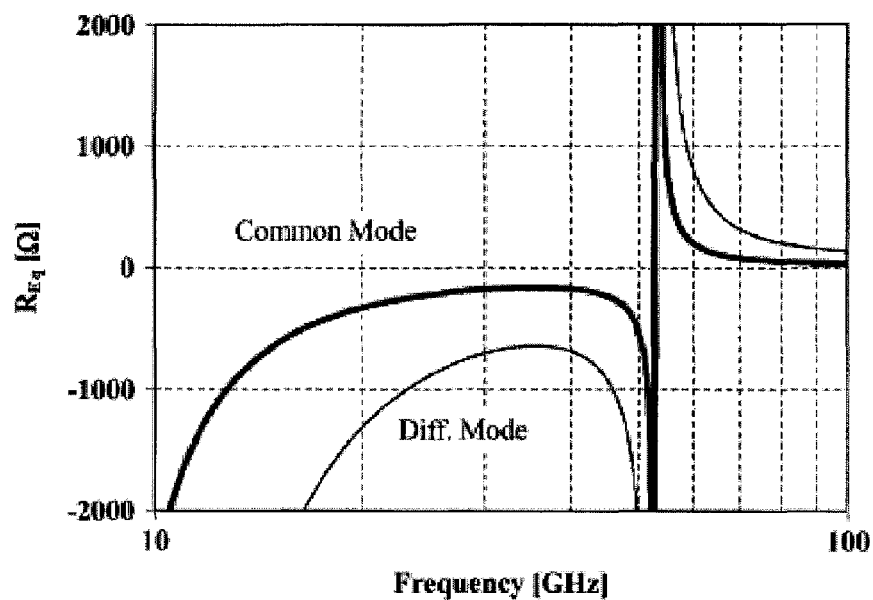
FIG. 15 is a plot showing common-mode negative resistance simulation results.
Figure 16:
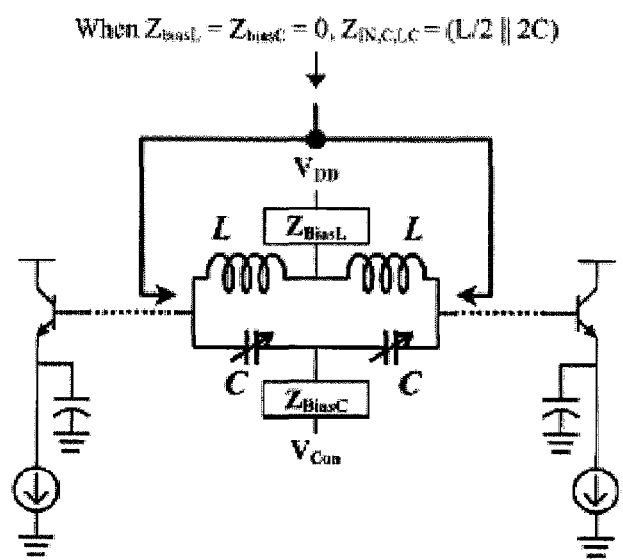
FIG. 16 illustrates a common-mode tank schematic with bias network impedance according to embodiments of the invention.
Figure 17:
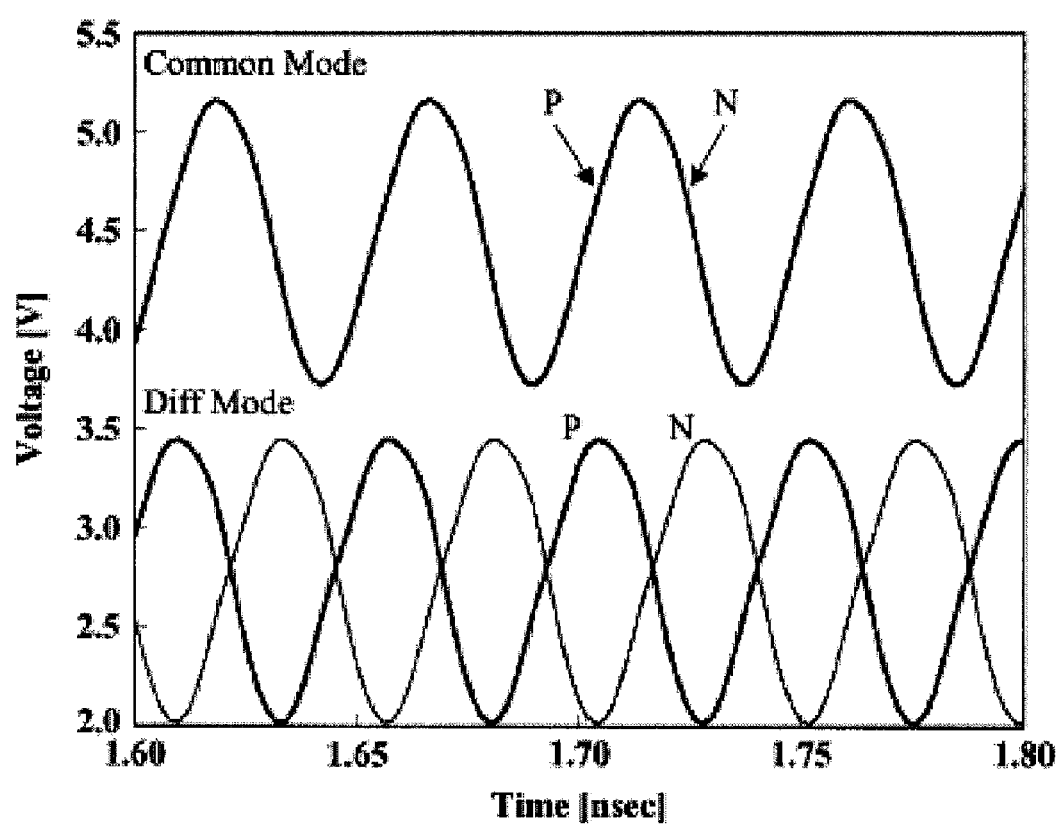
FIG. 17 is a graph illustrating common-mode and differential-mode oscillation simulations.

FIG. 15 shows the simulated common-mode and differential-mode $R_{Eq}$ for a capacitively emitter-degenerated cell where $C_S=0$. As seen in FIG. 15, the common mode shows a much smaller $|R_{Eq}|$. When this type of negative resistance cell is used, it is desirable to design the tank bias network to prevent common-mode oscillation. FIG. 16 shows the LC tank with a center tapped inductor and capacitor including the bias network. If $Z_{biasL}$ and $Z_{biasC}$ are very small, the common-mode impedance to ground becomes (L/2∥2C), and the circuit can now oscillate at $\omega=1/\sqrt{L(C+C_{EqH})}$ in the common mode. In fact, when $Z_{biasL}$ and $Z_{biasC}$ are zero, each half circuit becomes an independent oscillator, and there is no phase relationship constraint between two output signals. If $Z_{biasL}$ and $Z_{biasC}$ are very large, the common-mode impedance of the tank becomes very large, and the circuit cannot oscillate in the common mode. If the bias network impedance is zero, the circuit prefers to oscillate in the common mode. Thus, a large bias network impedance converts the oscillation mode from the common to differential mode. FIG. 17 shows the oscillation mode conversion from common mode to differential mode for the same circuit by simply altering the bias network impedance. The differential-mode signal is shifted down on this plot for graphical convenience only.

In the novel negative resistance cell with the cross-coupled MOS pair, the common-mode admittance of the MOS pair is near zero. Only the effective input capacitance of the buffer contributes to the common-mode negative resistance. This makes the novel cell less susceptible to common-mode oscillations as compared to a simple capacitively emitter-degenerated cell.

D. Wide Tuning Range

Figure 18B:
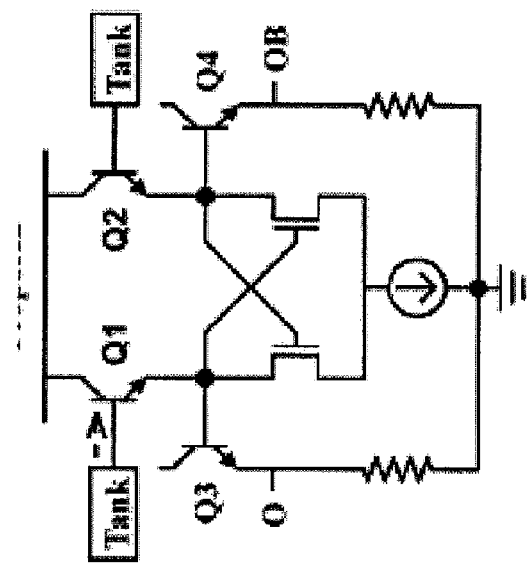
FIGS. 18A and 18B illustrate tank-loading characteristics of a cross-coupled cell and a cell according to embodiments of the invention.
Figure 18A:
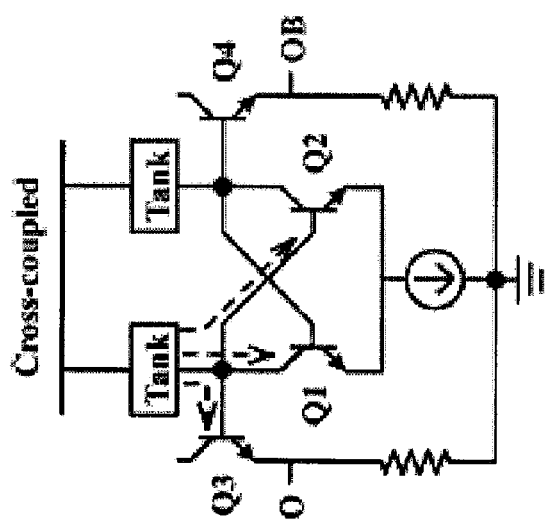

A wide tuning range is often important because it can accommodate more process and temperature variations. For high-frequency oscillator design, the effective capacitance from the negative resistance cell is one of the key factors that limit a wide tuning range. The novel capacitive emitter degenerating cell has a small effective capacitance. FIGS. 18A and 18B graphically show the mechanism that results in a small effective capacitance. In FIGS. 18A and 18B, Q3 and Q4 are buffer transistors. In the cross-coupled structure illustrated in FIG. 18A, the tank looks into the base of Q2, the collector of Q1, and the base of buffer transistor Q3. However, in the novel topology 1800 illustrated in FIG. 18B, the tank only looks into the base of Q1. Furthermore, the equivalent capacitance looking into the base of is much smaller than the $C_\pi$ of Q1, as shown above.

Figure 19:
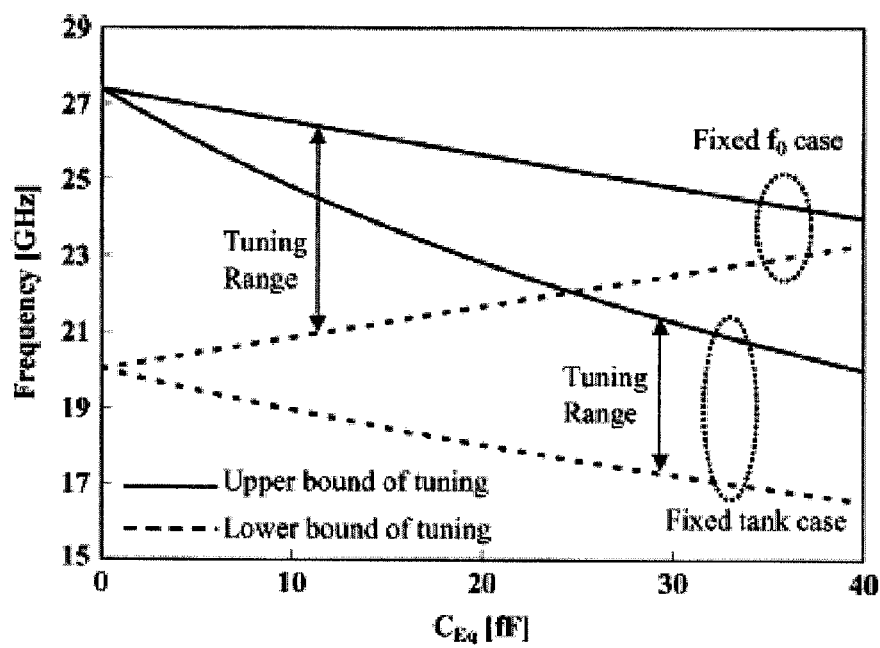
FIG. 19 is a graph illustrating a simulated tuning range versus effective capacitance of a negative resistance cell according to embodiments of the invention.

FIG. 19 shows how the effective capacitance of a negative resistance cell affects the oscillator tuning range. For this simulation, a two-turn spiral inductor with 740-pH inductance with 17-fF parasitic capacitance and diode varactors with capacitance range from 28.6 to 68.4 fF are used. The tuning range and center frequency go down rapidly with increasing parasitic capacitance of the negative resistance cell. In particular, if the center frequency is kept constant by changing the varactor size, the tuning range reduces even more rapidly, as shown in FIG. 19. For example, if the load at the output port in FIG. 18 is 200 fF, the equivalent shunt capacitance looking into the base of Q3 is approximately 44.4 fF. This parasitic loading causes severe frequency and tuning range limitations for the cross-coupled topology, as can be seen in FIG. 19. However, in the novel topology disclosed herein, the equivalent shunt capacitance looking into the base of Q3 functions as part of the emitter-degenerating capacitance, and the effective parasitic capacitance loading the tank is further attenuated by Q1.

A small effective capacitance also provides more room to increase the inductor size in the tank. In many cases, the $R_p$ of LC tank increases with increasing inductance value, so a large inductance enables large output signal power. Depending on the technology and the design constraint, the Q of the inductor can increase with increasing inductance. In this case, both the increased signal power and improved Q contributed by the small effective capacitance can result in lower phase noise, as can be seen in the modified Leeson's phase noise formula, described in J. W. M. Rogers, J. A. Macedo, and C. Plett, "The effect of varactor nonlinearity on the phase noise of completely integrated VCOs," *IEEE J. Solid-State Circuits*, vol. 35, pp. 1360-1367, September 2000 and shown as follows:

$$L(\Delta f, K_{VCO}) = 10 \log\left\{\left(\frac{f_0}{2Q\Delta f}\right)^2 \left[\frac{FkT}{2P_0}\left(1+\frac{f_C}{\Delta f}\right)\right] + \frac{1}{2}\left(\frac{K_{VCO}v_m}{2\Delta f}\right)^2\right\}(1 \quad (17)$$

where
$L(\Delta f, K_{VCO})$ phase noise in dBc/Hz;
$f_0$ frequency of oscillation in Hz;
$\Delta f$ frequency offset from the carrier in Hz;
F noise figure of the transistor amplifier;
k Boltzmann's constant in J/K;
T temperature in K;
$P_0$ RF power produced by the oscillator in W;
$f_C$ flicker noise corner frequency in Hz;
$K_{VCO}$ gain of the VCO in Hz/V;
$v_m$ total amplitude of all low-frequency noise sources in V/√Hz.

The first term within the log in equation (17) predicts a decreased phase noise with increasing tank and signal power. This discussion emphasizes that the small effective capacitance of the negative resistance cell is not only advantageous for high frequency and wide tuning design, but results in additional flexibility during the LC tank phase noise optimization process.

II. Experimental Results of a Particular Embodiment

Figure 20:
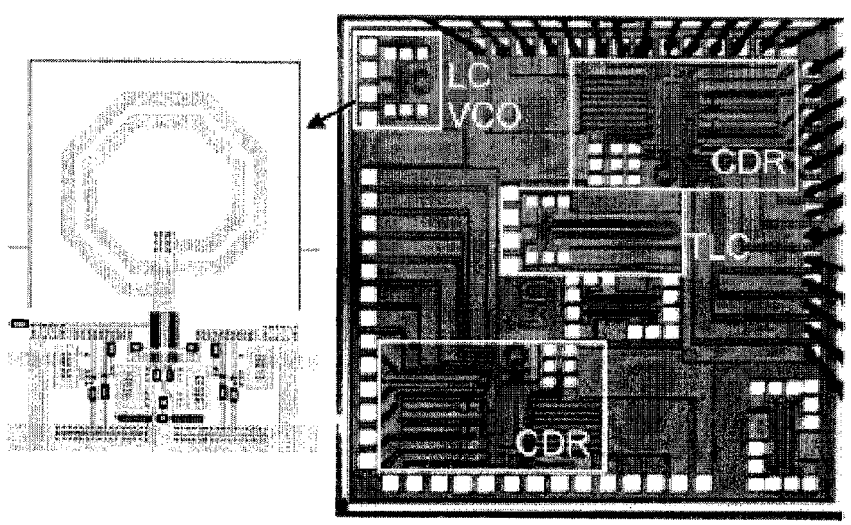
FIG. 20 is a chip microphotograph and layout according to embodiments of the invention.

In one embodiment, a 20-GHz VCO as described above with a 5-GHz tuning range has been designed using the IBM 0.25-m BiCMOS process. It is desirable to take into account the $g_{m1}/g_{m2}$ ratio for $R_{Eq}$ optimization of various embodiments. The $g_{m1}/g_{m2}$ (δ) ratio in some embodiments is about 0.3. At 20 GHz, the simulated $R_{eq}\approx-500\Omega$ and $C_{EQ}\approx13$ fF. This includes the effect of the buffer. It should be noted that $C_{Eq}$ is about ⅒th the $C_\pi$ of Q1, which is equal to 126 fF. In some embodiments, the VCO uses a two-stage emitter follower as buffers for each output. The capacitive impedance looking into this buffer works as a degeneration capacitance and contributes to the negative resistance. However, as described in the previous section, the degeneration using active devices is more desirable and the buffer has been designed to have minimal impact on this design. In some embodiments, two back-to-back junction diodes as described above are used as the varactor, and the anode is connected to the base of the BJT to minimize the N/substrate parasitic capacitance effect. The spiral inductor uses two turns to generate a 740-pH inductance. A single differential inductor is used for higher Q and to save area. This single inductor design without a center tap used in some embodiments also prevents common-mode oscillation. A chip microphotograph and VCO layout details according to an embodiment are shown in FIG. 20.

Figure 21:
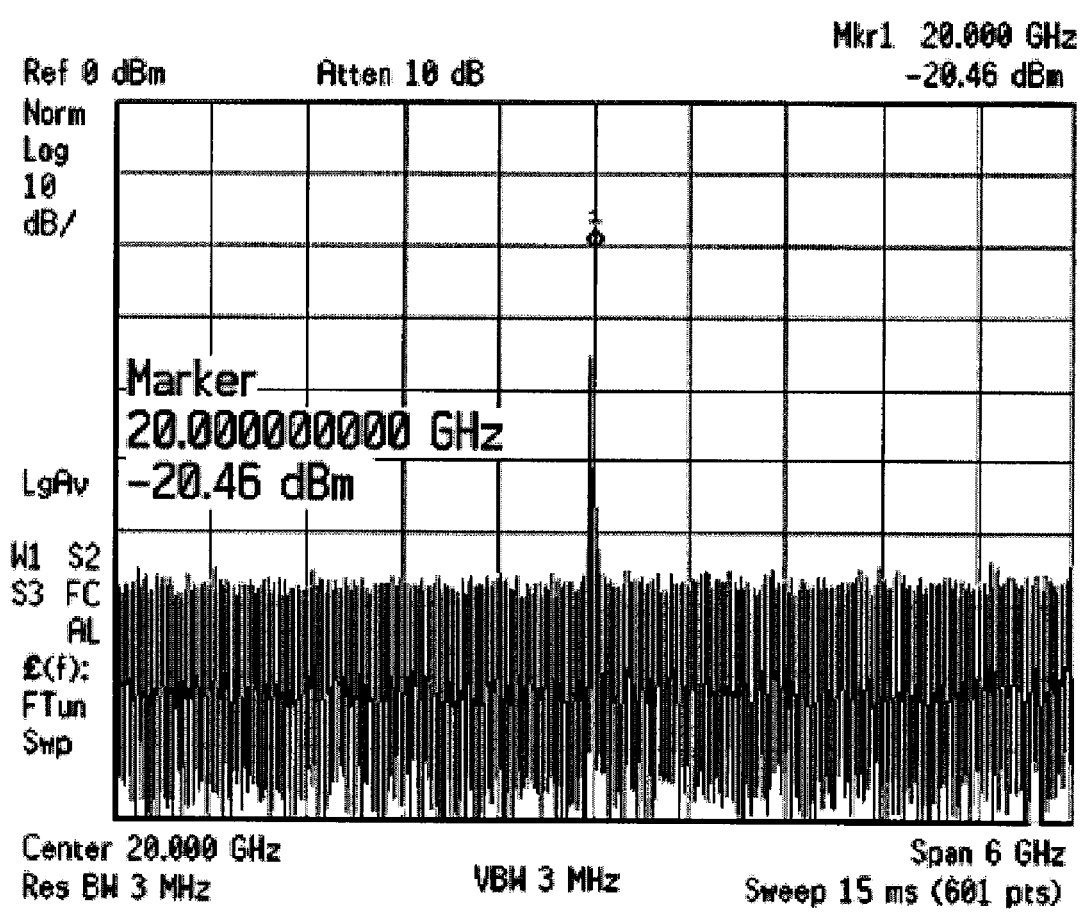
FIG. 21 shows the measured output power spectrum of a 20-GHz oscillation signal according to an embodiment of the invention.
Figure 22A:
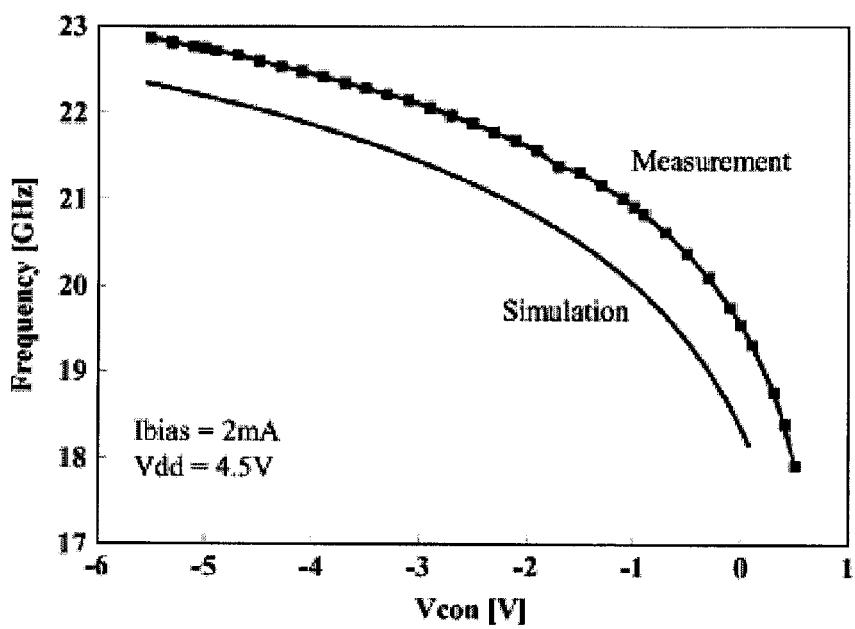
FIGS. 22A and 22B are graphs illustrating measured tuning range and simulated frequency variation according to the temperature and process variation and according to an embodiment of the invention.
Figure 22B:
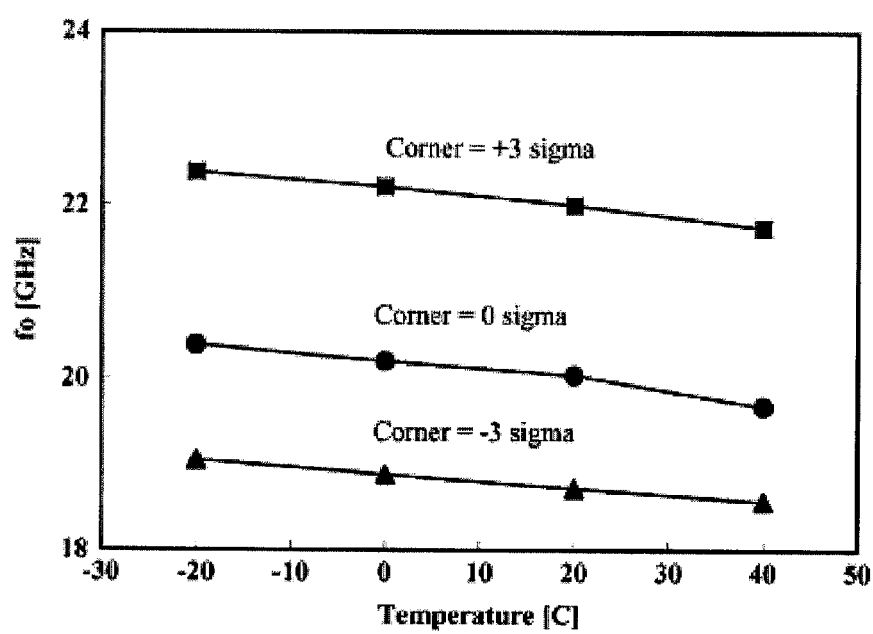
Figure 23:
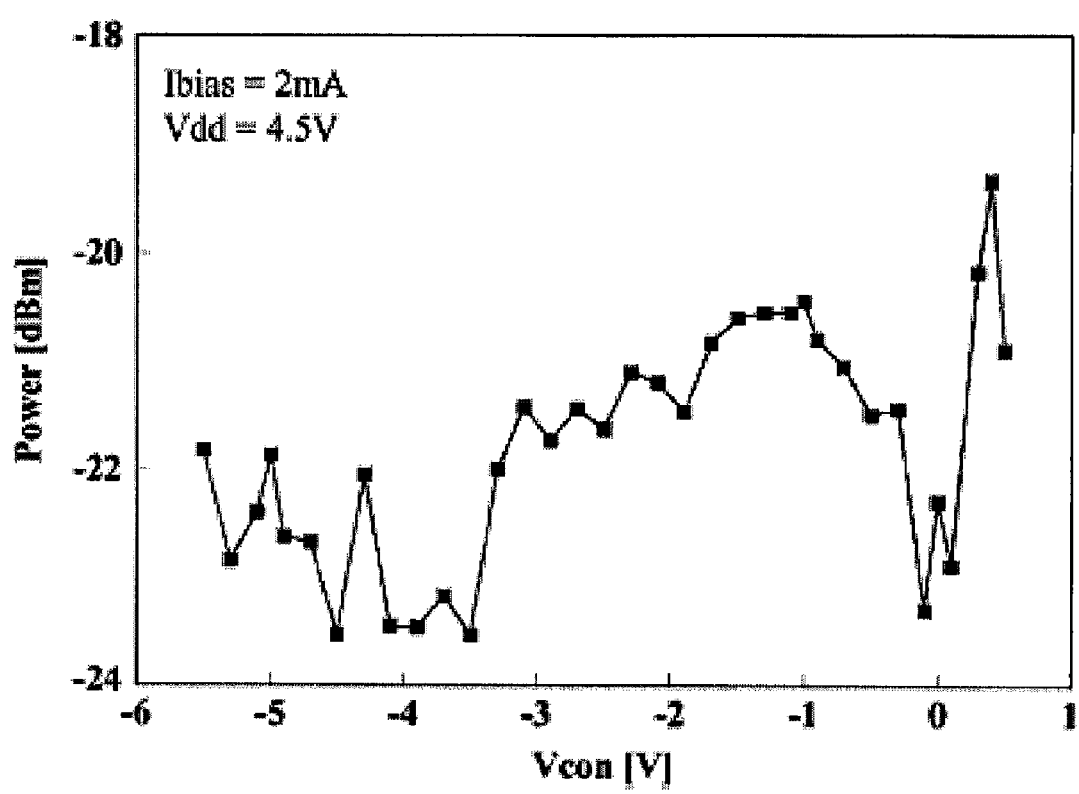
FIG. 23 is a graph illustrating measured power variation in an embodiment of the invention.

For the measurements, RF probes were used to directly connect to the bare die. A single-ended measurement setup has been used throughout. FIG. 21 shows the measured output power spectrum of the 20-GHz oscillation signal. The measured tuning range is compared with the simulated tuning range in FIG. 22(a). Measurement results show more than 5-GHz (25%) tuning range. This wide tuning was possible because of the low effective capacitance of the novel negative resistance cell. FIG. 22(b) shows simulated oscillation frequency at a fixed bias condition as a function of the temperature for different process corners. For these corner simulations, only the process corner parameter for bipolar devices has been considered, and six sigma variations have been considered. FIG. 22(b) shows that temperature and process variation results in about 4-GHz variation of the center frequency, clearly showing the desirability of a wide tuning range design that can tolerate temperature and process variations. The VCO core of some embodiments consumes only 2 mA, and each emitter follower branch drains 0.5 mA from a 4.5-V supply, respectively. This low bias current supports the low-power design capability of the novel topologies of the embodiments described above. Despite the wide tuning range, the maximum output power variation was less than 3.5 dBm over the whole frequency tuning range, as shown in FIG. 23.

Figure 24A:
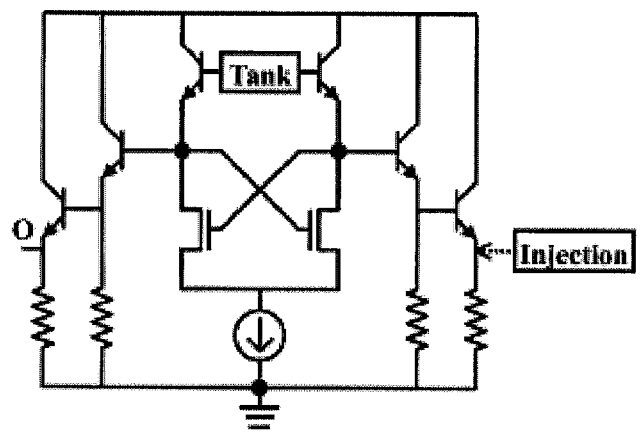
FIGS. 24A and 24B illustrate phase-noise measurement of an embodiment of the invention.
Figure 24B:
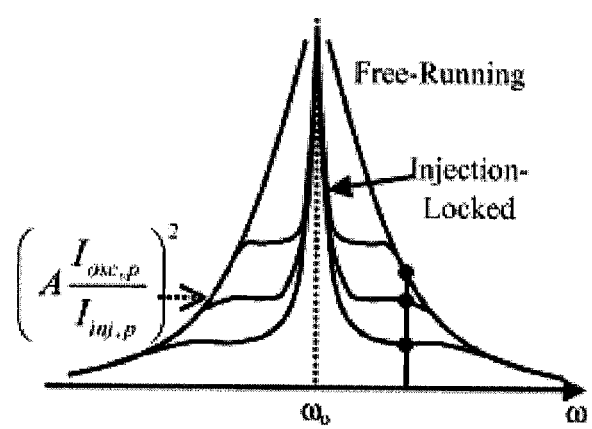

A low-power signal close to the noise floor is injected at the opposite side of differential output to remove the random drifting of the free running VCO, as shown in FIG. 24A. The phase noise of the injected signal was 121 dBc/Hz at a 2-MHz offset from the 19.4-GHz carrier. At high injection levels, the phase noise of the VCO follows the phase noise of the injected signal source. However, at low injection power levels, the locking range reduces and the phase noise approaches its intrinsic level, as shown in FIG. 24B.

Figure 25:
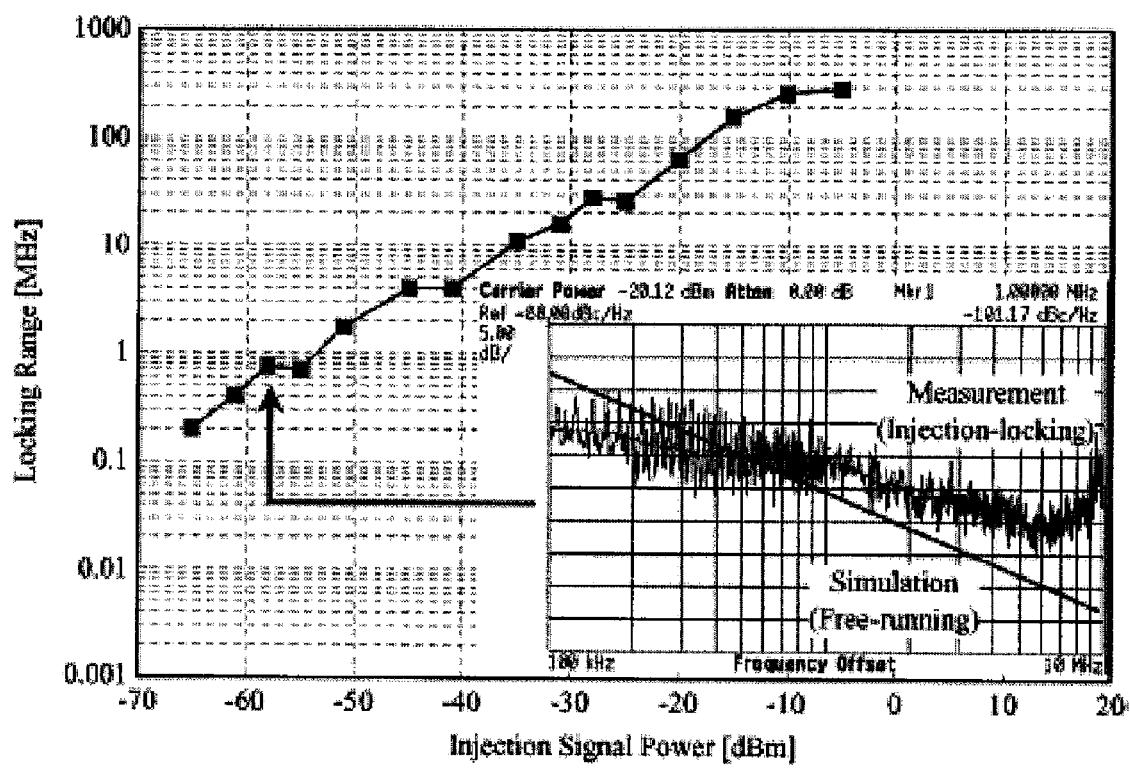
FIG. 25 is a graph illustrating locking range and phase-noise measurement results of an embodiment of the invention.

FIG. 25 shows the measured injection locking range as a function of injected signal power and the measured phase noise at an injected signal power of 58 dBm. At this injection level, the lock range is about 800 kHz. The actual power delivered to the tank is much smaller because of the attenuation through the buffer stage. The phase noise is measured at a 2-MHz offset from 19.4 GHz to eliminate the phase-noise attenuation through injection locking. The measured phase noise was 105.5 dBc/Hz. This value is obtained using an NMOS noise coefficient ($\gamma$) of $\frac{2}{3}$ and no induced gate noise contribution. For short-channel devices, $\gamma$ may reach 2.5, and induced gate noise should be included, as simulations underestimate the actual phase noise. It should be noted that the results detailed above are for a particular embodiment, and that other embodiments may exhibit different results.

III. Conclusion

In the previous sections, factors affecting the design of a negative resistance cell based LC VCOs have been discussed. The analysis included parasitics from the VCO core and the buffer stage. This discussion also analyzed the high-frequency performance and limitations of the capacitively degenerated negative resistance cell. Based on these analyses, a novel negative resistance cell topology is described that can overcome the limitations of the existing topologies. In some embodiments, the novel cell uses a cross-coupled MOS pair as a degeneration cell. The cross-coupled MOS pair contributes additional conductance and allows for the novel cell to have a higher maximum attainable oscillation frequency and better negative resistance characteristics in comparison with other topologies at high frequencies. These properties combined with its small effective capacitance enables low-power low-noise high-frequency VCO implementations. One embodiment includes a design for a 20-GHz fully integrated LC VCO implementation in the IBM SiGe 0.25-m BiCMOS technology.

Various embodiments of the invention have been described. The description of the exemplary embodiments of the invention is presented for the purposes of illustration and description, and is not intended to be exhaustive or to limit the invention to the precise forms disclosed. Many modifications and variations are possible in light of the above teaching.

As an example, the invention further contemplates a method for generating signals using a VCO as described herein, and well as methods for manufacture of the disclosed VCO. In addition, the VCO design described herein may be useful in a number of different applications, including wired and wireless communication systems. For example, a VCO as described herein may be implemented within a phase-locked loop (PLL) of a communication device.

The terminology used in this application is meant to include all of these environments. It is to be understood that the above description is intended to be illustrative, and not restrictive. Many other embodiments will be apparent to those of skill in the art upon reviewing the above description. Therefore, it is manifestly intended that the inventive subject matter be limited only by the following claims and equivalents thereof.

The Abstract is provided to comply with 37 C.F.R. § 1.72(b) to allow the reader to quickly ascertain the nature and gist of the technical disclosure. The Abstract is submitted with the understanding that it will not be used to limit the scope of the claims.

What is claimed is:

1. A voltage controlled oscillator (VCO) comprising:
an inductor-capacitor (LC) tank; and
a negative resistance cell coupled to the LC tank, wherein the negative resistance cell includes:
a first bipolar transistor,
a second bipolar transistor, and
at least two field-effect transistors, wherein the first and second bipolar transistors are interconnected via the field-effect transistors.
wherein the LC tank is coupled to a base of the first bipolar transistor and to a base of the second bipolar transistor, the base of the first bipolar transistor and the base of the second bipolar transistor being the only connections between the LC tank circuit and the negative resistance cell, and wherein the base of the first bipolar transistor is connected to only the LC tank, and the base of the second bipolar transistor is connected to only the LC tank.

2. The VCO of claim 1, wherein an emitter of the first bipolar transistor is coupled to a gate of a first one of the field-effect transistors and an emitter of the second bipolar transistor is coupled to a gate of a second one of the field-effect transistors.

3. The VCO of claim 2, wherein the emitter of the first bipolar transistor is coupled to a drain of the second one of the field-effect: transistors and the emitter of the second bipolar transistor is coupled to a drain of a first one of the field-effect transistors.

4. The VCO of claim 3, wherein the negative resistance cell further comprises a current source that is coupled to a source of each of the field-effect transistors.

5. The VCO of claim 1, further comprising a buffer circuit for buffering an output of the VCO.

6. The VCO of claim 5, wherein the buffer circuit comprises:

a first buffer coupled to the emitter of the first bipolar transistor, and a second buffer coupled to the emitter of the second bipolar transistor.

7. The VCO of claim 6, wherein the first and second buffer comprise emitter followers.

8. The VCO of claim 1, wherein the field-effect transistors comprise metal-oxide-semiconductor field-effect transistors (MOSFETs).

9. The VCO of claim 1, wherein the field-effect transistors include NMOS devices.

10. The VCO of claim 1, wherein the negative resistance cell has an input admittance calculated as:

$$Y_{IN} = \frac{\frac{1}{2}\left[g_{m2}\left(\frac{r_g}{Z_g}-1\right)+\frac{1}{Z_g}\right]}{[1+g_{m1}Z'_\pi]+Z_\pi\left[g_{m2}\left(\frac{r_g}{Z_g}-1\right)+\frac{1}{Z_g}\right]}$$

where $Z'_\pi=(r_\pi \| 1/sC_\pi)$, $Z_\pi=r_b+Z'_\pi$, $Z_g=r_g+1/sC_{gs}$, and $g_{m1}$ and $g_{m2}$ are transconductance of the BJT and the nMOS transistor, respectively.

11. A voltage controlled oscillator (VCO) comprising:
a first pair of transistors including a first bipolar transistor and a second bipolar transistor;
a second pair of transistors including a first field-effect transistor and a second field effect transistor, the first field effect transistor having a gate connected to a drain of the second field-effect transistor and to an emitter of the first bipolar transistor, the second field effect transistor having a gate connected to a drain of the first field-effect transistor and to an emitter of the second bipolar transistor;

a first buffer circuit coupled to the emitter of the first bipolar transistor, the first buffer circuit operable to receive a low-power signal injection;

a second buffer circuit coupled to the emitter of the second bipolar transistor, the second buffer circuit providing an output; and an inductor-capacitor (LC) tank directly connected to a base of the first bipolar transistor and directly connected to a base of the second bipolar transistor, wherein the base of the first bipolar transistor is connected to only the LC tank, the base of the second bipolar transistor is connected to only the LC tank, and the base of the first bipolar transistor and the base of the second bipolar transistor are the only connections to the LC tank.

12. The VCO of claim 11, further comprising a current source coupled to the second pair of transistors.

13. The VCO of claim 11, wherein the VCO has a maximum operating frequency of at least 20 GHz.

14. The VCO of claim 11, wherein the VCO has at least a 5 GHz tuning range.

15. The VCO of claim 11, wherein at 20 GHz the VCO has an effective shunt capacitance ($C_{Eq}$) of approximately 13 femtofarads.

16. The VCO of claim 11, wherein at 20 GHz the VCO has an effective negative resistance ($R_{Eq}$) of approximately −500 ohms.

17. The VCO of claim 11, wherein the first buffer stage and the second buffer stage each include a two-stage emitter follower.

* * * * *

UNITED STATES PATENT AND TRADEMARK OFFICE
CERTIFICATE OF CORRECTION

PATENT NO.         : 7,385,452 B2
APPLICATION NO. : 11/275974
DATED              : June 10, 2008
INVENTOR(S)       : Harjani It is certified that error appears in the above-identified patent and that said Letters Patent is hereby corrected as shown below:

In column 7, line 42, delete "$C_n \| r_{n)\text{and ZOSC}}$" and insert -- $C_n \| r_n$ ) and $Z_{OSC}$ --, therefor.

In column 12, line 46, delete "$C_{EQ\,t} \approx 13$" and insert -- $C_{EQ} \approx 13$ --, therefor.

In column 13, line 42, delete "NMOS" and insert -- nMOS --, therefor.

In column 14, line 41, in Claim 1, delete "transistors." and insert -- transistors; --, therefor.

Signed and Sealed this

Ninth Day of September, 2008

JON W. DUDAS
*Director of the United States Patent and Trademark Office*